(12) United States Patent
Wang

(10) Patent No.: US 11,482,603 B2
(45) Date of Patent: Oct. 25, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 8 days.

(21) Appl. No.: 17/025,682

(22) Filed: Sep. 18, 2020

(65) Prior Publication Data
US 2021/0091192 A1    Mar. 25, 2021

(30) Foreign Application Priority Data
Sep. 23, 2019 (CN) ......................... 201910899412.6

(51) Int. Cl.
| H01L 21/768 | (2006.01) |
| H01L 21/311 | (2006.01) |
| H01L 29/417 | (2006.01) |
| H01L 29/66 | (2006.01) |
| H01L 29/78 | (2006.01) |
| H01L 21/285 | (2006.01) |
| H01L 29/45 | (2006.01) |

(52) U.S. Cl.
CPC .. *H01L 29/41791* (2013.01); *H01L 21/28568* (2013.01); *H01L 21/31111* (2013.01); *H01L 21/31116* (2013.01); *H01L 21/31144* (2013.01); *H01L 29/45* (2013.01); *H01L 29/66795* (2013.01); *H01L 29/7851* (2013.01)

(58) Field of Classification Search
CPC ......... H01L 29/41791; H01L 29/66795; H01L 29/7851; H01L 21/823431; H01L 27/0886; H01L 29/785
See application file for complete search history.

(56) References Cited

U.S. PATENT DOCUMENTS

| 2018/0005886 A1* | 1/2018 | Zhang | ................... H01L 29/788 |
| 2019/0067478 A1* | 2/2019 | Chu | ........................ H01L 29/24 |
| 2020/0251379 A1* | 8/2020 | Wang | ................... H01L 27/0886 |

* cited by examiner

*Primary Examiner* — Fernando L Toledo
*Assistant Examiner* — Valerie N Newton
(74) *Attorney, Agent, or Firm* — Anova Law Group, PLLC

(57) ABSTRACT

A semiconductor device and a method for forming the semiconductor device are provided. The method includes providing a substrate; forming a fin on the substrate, where the substrate includes a fin dense region and a fin sparse region; forming a gate structure across the fin over the substrate; forming a source-drain doped layer in the fin on both sides of the gate structure; forming a dielectric layer over the substrate, where the dielectric layer covers a top of the gate structure; and forming a first through-hole in the dielectric layer on a side of the gate structure in the fin sparse region, where a bottom of the first through-hole exposes a top sidewall of the gate structure.

20 Claims, 14 Drawing Sheets

SEMICONDUCTOR DEVICE AND FABRICATION METHOD THEREOF

CROSS-REFERENCES TO RELATED APPLICATIONS

This application claims the priority of Chinese patent application No. 201910899412.6, filed on Sep. 23, 2019, the entirety of which is incorporated herein by reference.

FIELD OF THE DISCLOSURE

The present disclosure generally relates to the field of semiconductor manufacturing technology and, more particularly, relates to a semiconductor device and a fabrication method thereof.

BACKGROUND

With rapid development of semiconductor manufacturing technology, semiconductor devices have been developing towards higher component density and higher degree of integration. As the most basic semiconductor devices, transistors are currently being widely used. In order to adapt to a smaller critical dimension, a channel length of a traditional planar metal-oxide-semiconductor field-effect transistor (MOSFET) is also increasingly smaller. However, as a channel length of a device keeps shrinking, the channel control capability of a gate structure deteriorates, and there is increasing difficulty in pinching the channel off by a gate voltage, resulting in a higher risk of subthreshold leakage, that is, the so-called short-channel effect (SCE). Consequently, the device performance of the semiconductor device may be degraded.

To overcome the short-channel effect of the device and to suppress the leakage current, a fin field-effect transistor (FinFET) has been proposed in the existing technology. The FinFET is a common multi-gate device. A structure of the FinFET includes a fin and an isolation structure on a surface of a semiconductor substrate. The isolation structure covers a portion of the sidewall of the fin, and a surface of the isolation structure is lower than a top of the fin. The FinFET also includes a gate structure on the surface of the isolation structure and on the top and sidewall surfaces of the fin. Further, the FinFET includes a source region and a drain region in the fin on both sides of the gate structure.

However, as the size of the semiconductor device shrinks and device density increases, the process difficulty of forming the FinFET increases, and the device performance of the formed FinFET is unstable. The disclosed methods and device structures are directed to solve one or more problems set forth above and other problems.

BRIEF SUMMARY OF THE DISCLOSURE

One aspect of the present disclosure includes a method for forming a semiconductor device, including: providing a substrate; forming a fin on the substrate, where the substrate includes a fin dense region and a fin sparse region; forming a gate structure across the fin over the substrate; forming a source-drain doped layer in the fin on both sides of the gate structure; forming a dielectric layer over the substrate, where the dielectric layer covers a top of the gate structure; and forming a first through-hole in the dielectric layer on a side of the gate structure in the fin sparse region, where a bottom of the first through-hole exposes a top sidewall of the gate structure.

Optionally, the dielectric layer is made of a material including silicon oxide, silicon nitride, silicon boronitride, silicon oxy-carbo-nitride, silicon oxynitride, or a combination thereof.

Optionally, forming the first through-hole includes a dry etching method, a wet etching method, or a combination thereof.

Optionally, the method further includes etching the dielectric layer on the top of the gate structure to form a second through-hole in the dielectric layer, where the second through-hole exposes a portion of the top of the gate structure.

Optionally, forming the first through-hole and the second through-hole includes: forming a first mask layer on the dielectric layer, where the first mask layer has openings exposing a top of the dielectric layer on the side of the gate structure in the fin sparse region and a portion of the dielectric layer on the top of the gate structure, respectively; using the first mask layer as a mask, removing the exposed dielectric layer by etching to form the first through-hole and the second through-hole in the dielectric layer; and removing the first mask layer.

Optionally, the method further includes etching the dielectric layer on the source-drain doped layer until a top of the source-drain doped layer is exposed, to form a third through-hole in the dielectric layer.

Optionally, forming the third through-hole includes: forming a second mask layer on the dielectric layer, where the second mask layer has an opening exposing the dielectric layer on the top of the source-drain doped layer; removing the exposed dielectric layer by etching to form the third through-hole in the dielectric layer; and removing the second mask layer.

Optionally, after forming the third through-hole, the method further includes forming a metal layer to fill the first through-hole, the second through-hole and the third through-hole.

Optionally, the metal layer is made of tungsten, cobalt, titanium, nickel, or a combination thereof.

Optionally, forming the metal layer includes an atomic layer deposition method, a chemical vapor deposition method, a physical vapor deposition method, or a combination thereof.

Optionally, the method further includes forming an isolation layer on the substrate and covering a portion of a sidewall of the fin.

Optionally, before forming the dielectric layer on the substrate, the method further includes forming an etching stop layer over the substrate, on a portion of a sidewall of the fin, on top and sidewall surfaces of the source-drain doped layer, and on a sidewall of the gate structure.

Optionally, before forming the metal layer, the method further includes forming an adhesion layer on the bottom and sidewalls of the first through-hole, the second through-hole, and the third through-hole.

Another aspect of the present disclosure includes a semiconductor device, including: a substrate; a fin on the substrate, where the substrate includes a fin dense region and a fin sparse region; a gate structure over the substrate and across the fin; a source-drain doped layer in the fin on both sides of the gate structure; a dielectric layer over the substrate and covering the gate structure; and a first through-hole in the dielectric layer on a side of the gate structure between fins in the fin sparse region, where a bottom of the first through-hole exposes a top sidewall of the gate structure.

Optionally, the dielectric layer is made of a material including silicon oxide, silicon nitride, silicon boronitride, silicon oxy-carbo-nitride, silicon oxynitride, or a combination thereof.

Optionally, the dielectric layer further contains a second through-hole, where a bottom of the second through-hole exposes a portion of a top of the gate structure.

Optionally, the dielectric layer further contains a third through-hole, where a bottom of the third through hole exposes a top of the source-drain doped layer.

Optionally, the semiconductor device further includes a metal layer filling the first through-hole, the second through-hole and the third through-hole.

Optionally, the metal layer is made of tungsten, cobalt, titanium, nickel, or a combination thereof.

Optionally, the semiconductor device further includes an etching stop layer over the substrate, on a portion of a sidewall of the fin, on top and sidewall surfaces of the source-drain doped layer, and on a sidewall of the gate structure.

The disclosed embodiments of the present disclosure may have following beneficial effects. When forming the fin, the gate structure across the fin, and the source-drain doped layer in the fin on both sides of the gate structure over the substrate, the dielectric layer covering the top of the gate structure may be formed over the substrate. A first through-hole may be formed in the dielectric layer on the side (e.g., a side of source region) of the gate structure between the fins in the fin sparse region. The bottom of the first through-hole may expose the top sidewall of the gate structure, and the depth of the first through-hole may be substantially small. When subsequently filling the first through-hole with the metal layer, the volume of the metal layer filled in the first through-hole may be reduced. Therefore, the parasitic capacitance generated between the gate structure and the junction of the source-drain doped layers may be reduced, thereby improving the device performance and quality of the formed semiconductor device, and improving the sensitivity.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

For an existing semiconductor device, the parasitic capacitance generated between the gate structure and the junction of the source-drain doped layers is substantially large, which seriously affects the device performance of the semiconductor device. FIGS. 1-11 illustrate semiconductor structures corresponding to certain stages for forming the semiconductor device.

Figure 1:
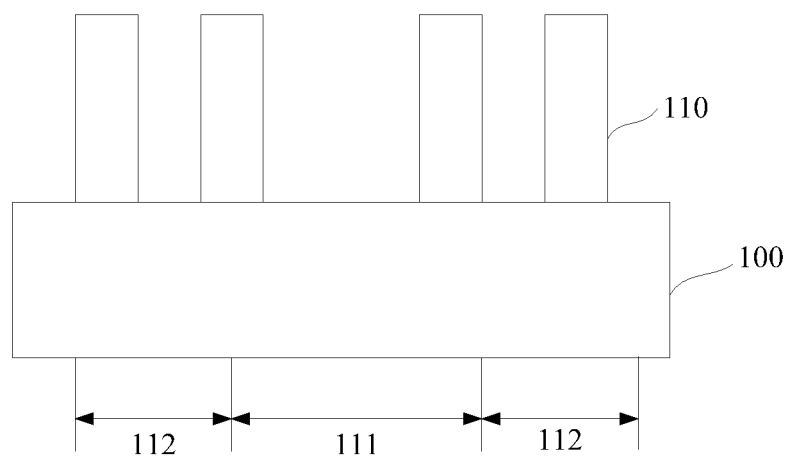
FIGS. 1-11 illustrate semiconductor structures corresponding to certain stages for forming a semiconductor device.

Referring to FIG. 1, a substrate 100 is provided, and a plurality of fins 110 are formed on the substrate 100. The substrate includes a fin sparse region 111 and a fin dense region 112.

Figure 2:
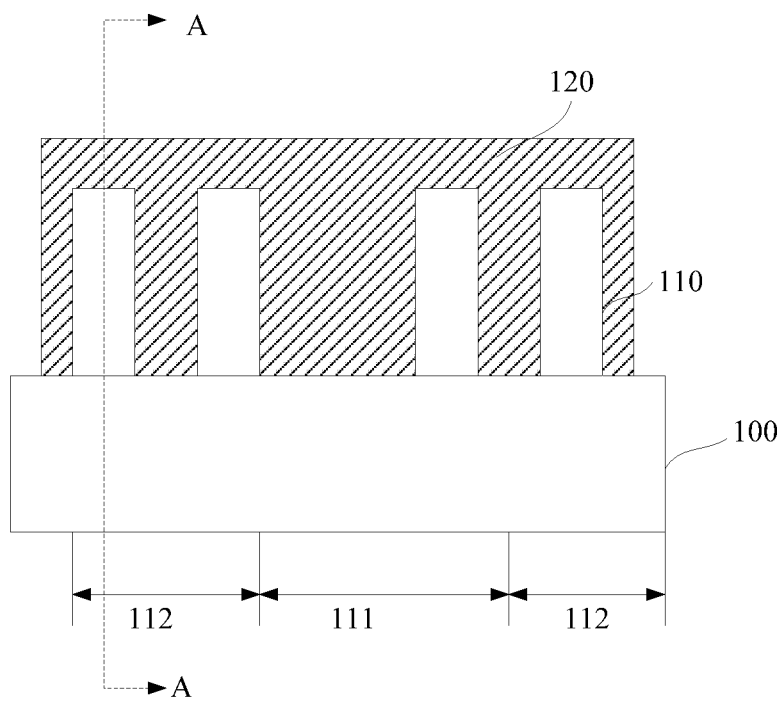

Referring to FIG. 2, a gate structure 120 across a length portion of the fin 110 is formed over the substrate 100.

Figure 3:
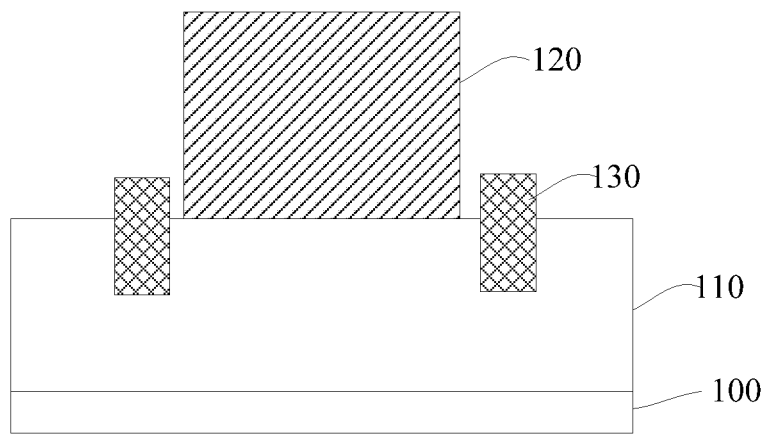

FIG. 3 illustrates a schematic A-A sectional view of the structure in FIG. 2. Referring to FIG. 3, source-drain doped layers 130 are formed in the fin 110 on both sides of the gate structure 120.

Figure 4:
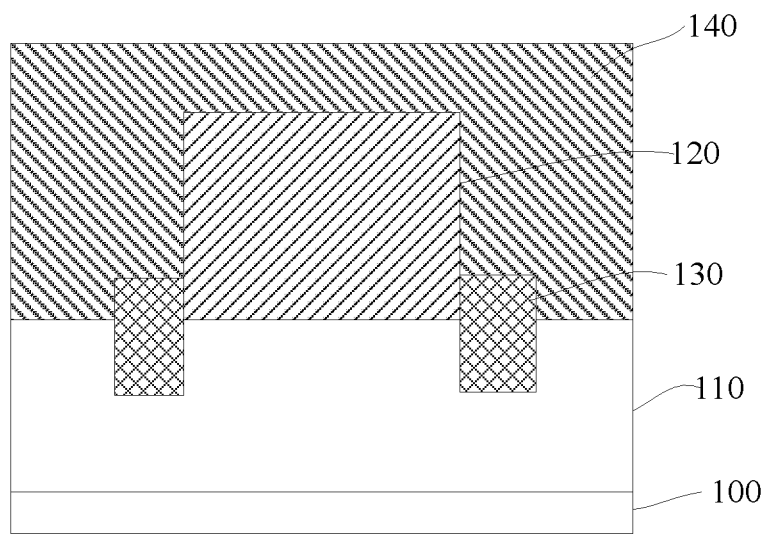
Figure 5:
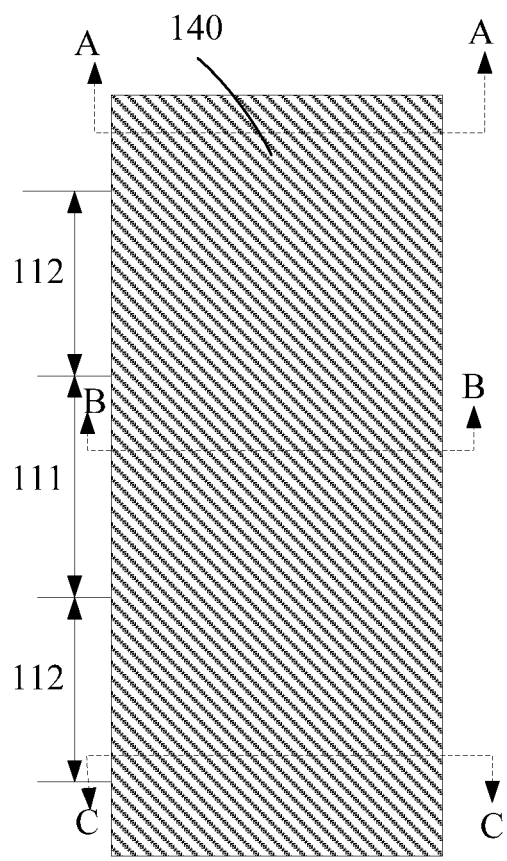

FIG. 5 illustrates a schematic top-view of the structure in FIG. 4. Referring to FIG. 4 and FIG. 5, a dielectric layer 140 is formed over the substrate 100. The dielectric layer 140 covers the source-drain doped layers 130 and the gate structure 120, and a top surface of the dielectric layer 140 is higher than a top surface of the gate structure 120.

A mask layer (not illustrated in the Figure) is formed on the dielectric layer 140. The mask layer has openings exposing a portion of the dielectric layer 140 on the top of the gate structure 120, the dielectric layer 140 on the source-drain doped layer 130, and the dielectric layer 140 on a side of the gate structure 120 between the fins 120 in the fin sparse region 111, respectively.

Figure 6:
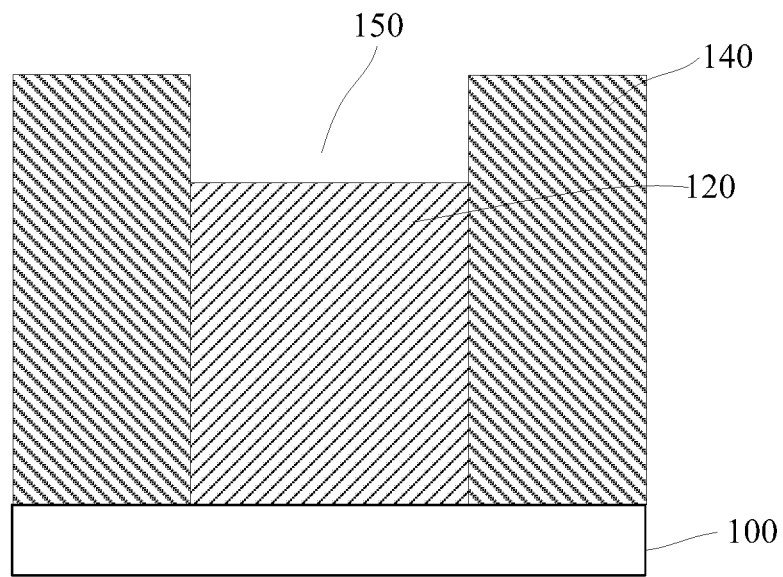

FIG. 6 illustrates a schematic A-A sectional view of the structure in FIG. 5 after removing the exposed dielectric layer 140. Referring to FIG. 6, the dielectric layer 140 on the top of the gate structure 120 is etched to form a second through-hole 150. A bottom of the second through-hole 150 exposes the top surface of the gate structure 120.

Figure 7:
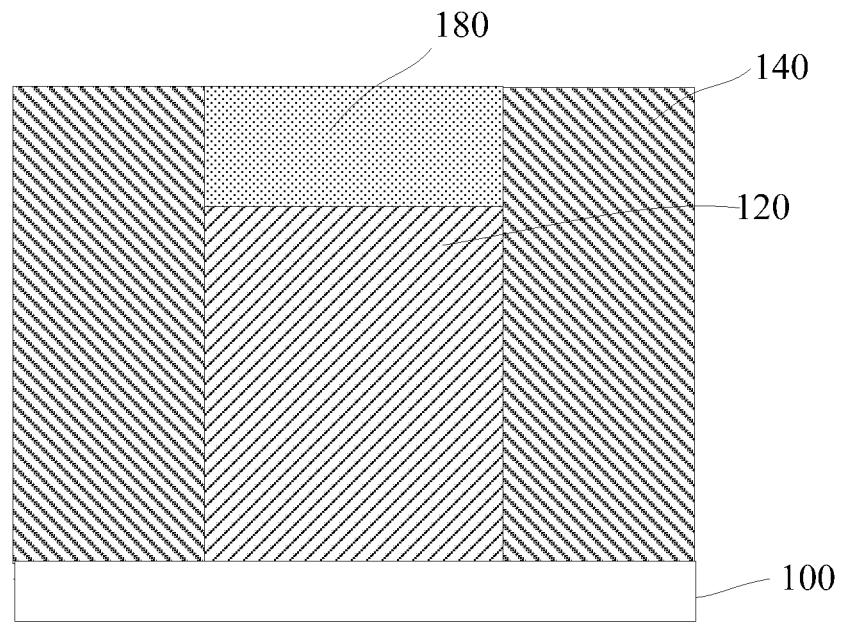

Referring to FIG. 7, a metal layer 180 fills the second through-hole 150.

Figure 8:
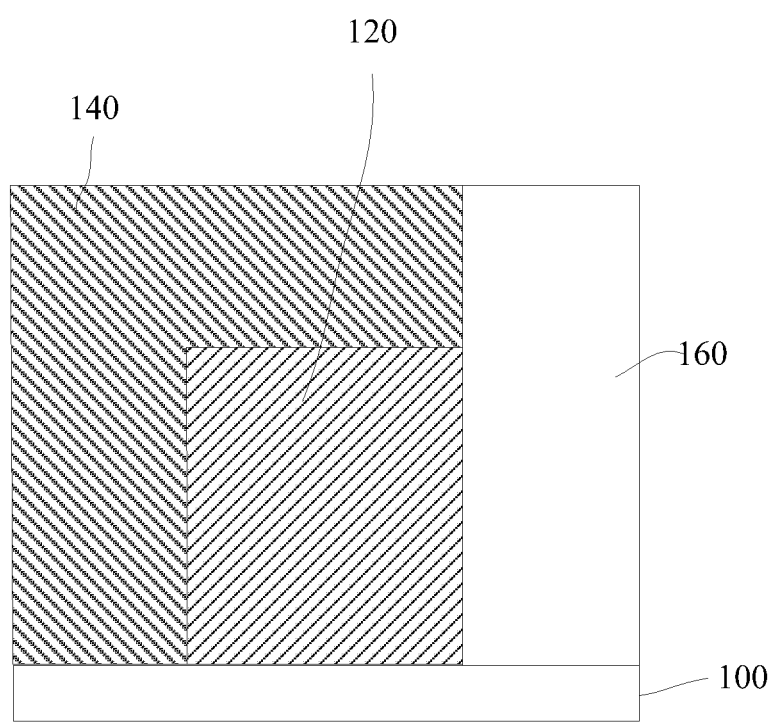

FIG. 8 illustrates a schematic B-B sectional view of the structure in FIG. 5 after removing the exposed dielectric layer 140. Referring to FIG. 8, the dielectric layer 140 on the side of the gate structure 120 between the fins in the fin sparse region 111 is etched to form a first through-hole 160. A bottom of the first through-hole 160 exposes the surface of the substrate 100.

Figure 9:
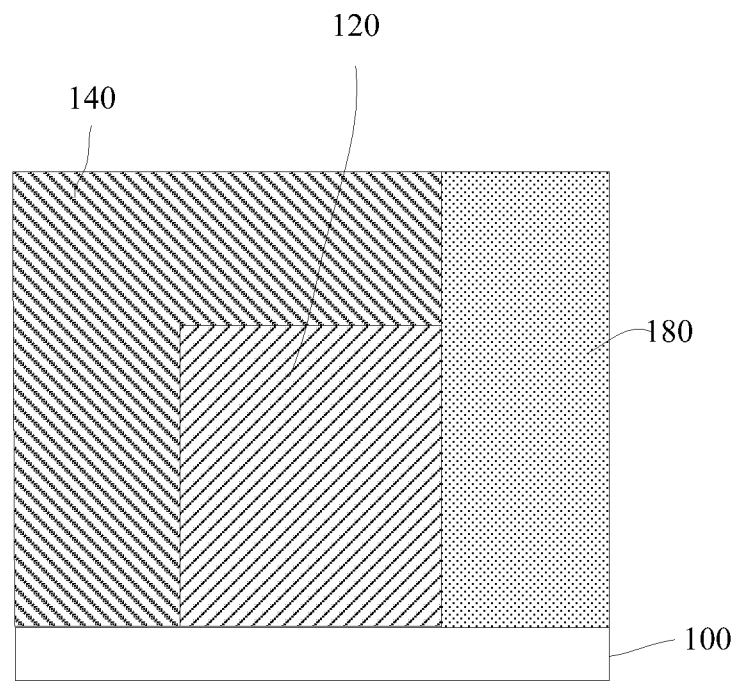

Referring to FIG. 9, the metal layer 180 fills the first through-hole 160.

Figure 10:
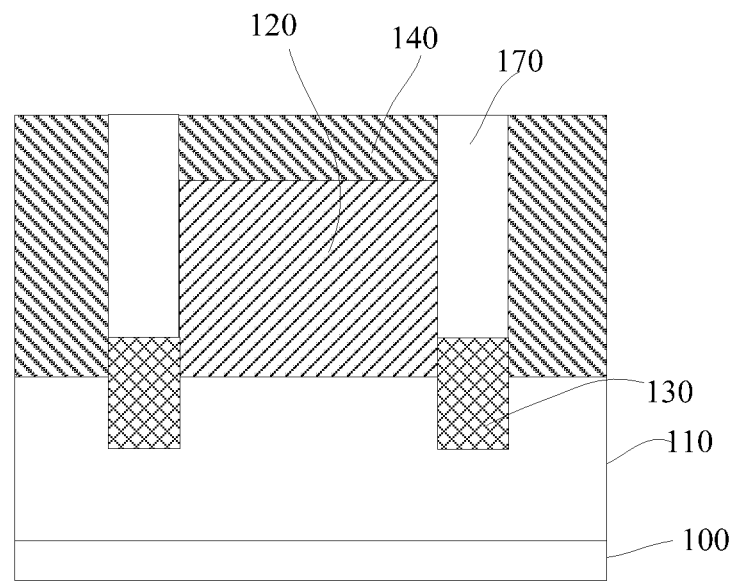

FIG. 10 illustrates a schematic C-C sectional view of the structure in FIG. 5 after removing the exposed dielectric layer 140. Referring to FIG. 10, the dielectric layer 140 on the source-drain doped layer 130 on both sides of the gate structure 120 is etched to form a third through-hole 170. A bottom of the third through-hole 170 exposes the top surface of the source-drain doped layer 130.

Figure 11:
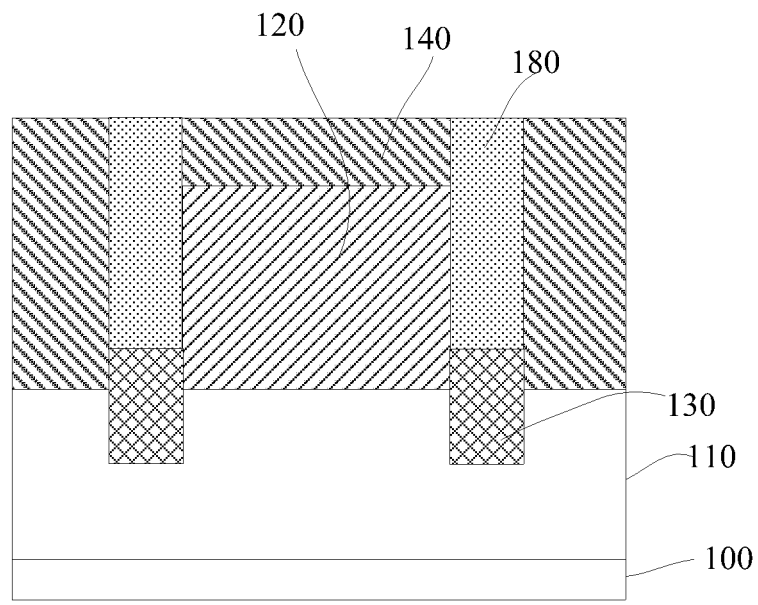

Referring to FIG. 11, a metal layer 180 fills the third through-hole 170.

In the fin sparse region, the dielectric layer on the side of the gate structure is etched to form the first through-hole. The bottom of the first through-hole exposes the surface of the substrate, and the metal layer fills the first through-hole to achieve the electrical connection between the source-drain doped layers in the fins on both sides of the fin sparse region. However, because the bottom of the first through-hole exposes the surface of the substrate, a depth of such formed first through-hole is substantially large, and, thus, the volume of the filled metal layer is substantially large. Therefore, the parasitic capacitance generated between the gate structure and the junction of the source-drain doped layers is substantially large, which reduces the sensitivity and stability of the semiconductor device during use, and limits the application of the semiconductor device.

When forming a metal layer to electrically connect the source-drain doped layers in the fins in the fin sparse region, the dielectric layer on the side of the gate structure is etched to form the first through-hole. As long as the bottom of the first through-hole exposes the top sidewall of the gate structure, when the first through-hole is filled with the metal layer, on the one hand, the electrical connection between the source-drain doped layers in the fins in the fin sparse region is achieved, and on the other hand, the volume of the metal layer filling the first through-hole is reduced. Therefore, the parasitic capacitance generated between the gate structure and the junction of the source-drain doped layers is reduced, the performance stability and sensitivity of the formed semiconductor device is improved, and the application of the semiconductor device is expanded.

The present disclosure provides a semiconductor device and a method for forming the semiconductor device. FIG. 28 illustrates a flowchart of a method for forming a semiconductor device consistent with various disclosed embodiments of the present disclosure, and FIGS. 12-27 illustrate semiconductor structures corresponding to certain stages of the fabrication method.

Figure 12:
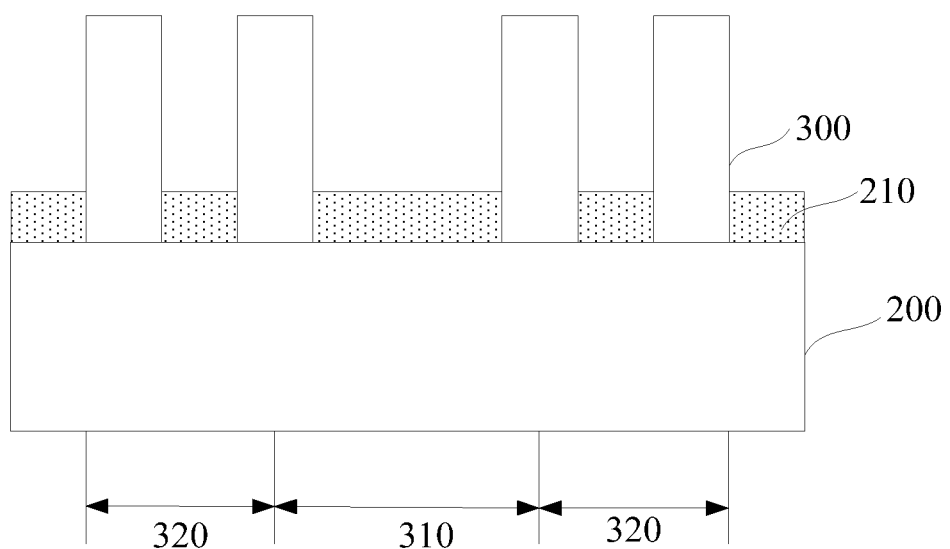
FIGS. 12-27 illustrate semiconductor structures corresponding to certain stages for forming an exemplary semiconductor device consistent with various disclosed embodiments of the present disclosure.

As shown in FIG. 28, at the beginning of the fabrication method, a substrate with certain structures may be provided and a fin may be formed (S101). FIG. 12 illustrates a corresponding semiconductor structure.

Referring to FIG. 12, a substrate 200 may be provided, and a fin 300 may be formed on the substrate 200. The substrate 200 may include a fin sparse region 310 and a fin dense region 320.

In one embodiment, the substrate 200 may be made of silicon. In another embodiment, the substrate 200 may be made of semiconductor materials such as germanium, silicon germanium, gallium arsenide, and indium gallium arsenide, etc. In certain embodiments, the substrate may be a semiconductor-on-insulator structure. The semiconductor-on-insulator structure may include an insulator and a semiconductor material layer on the insulator. The semiconductor material layer may be made of semiconductor materials such as silicon, germanium, silicon germanium, gallium arsenide, and indium gallium arsenide, etc.

In one embodiment, forming the fin 300 may include: forming a patterned layer (not illustrated in the Figure) on the substrate 200, where the patterned layer may have an opening corresponding to the position of the to-be-formed fin 300; using the patterned layer as a mask, etching a portion of the substrate 200 along a thickness direction to form a plurality of discretely arranged fins 300 on the substrate 200; and removing the patterned layer.

In another embodiment, forming the fin 300 may include: depositing a material layer of the fin 300 on the substrate 200; forming a patterned layer on the material layer of the fin 300, where the patterned layer may have an opening corresponding to the position of the to-be-formed fin 300; using the patterned layer as a mask, etching the material layer of the fin 300 until the surface of the substrate 200 is exposed, to form a plurality of discretely arranged fins 300 on the substrate 200; and removing the patterned layer.

In one embodiment, an isolation layer 210 may be formed on the substrate 200. The isolation layer 210 may cover a portion of the sidewall of the fin 300. In another embodiment, the isolation layer may not be formed on the substrate 200. In one embodiment, the isolation layer 210 may be made of silicon oxide. In another embodiment, the isolation layer 210 may be made of silicon nitride, silicon carbide, or a combination thereof. In one embodiment, the isolation layer 210 may be configured to isolate adjacent fins 300, to prevent subsequent occurrence of leakage and short circuit, etc.

Forming the isolation layer 210 may include: forming an isolation layer film (not illustrated) covering the fin 300 over the substrate 200; and back-etching the isolation layer film to form the isolation layer 210. Forming the isolation layer film may include a deposition process, e.g., a fluid chemical vapor deposition process. The isolation layer film formed by the fluid chemical vapor deposition process may have desired filling performance.

Steps of the fluid chemical vapor deposition process for forming the isolation layer film may include: forming an isolation fluid layer over the substrate 200; and performing a steam annealing treatment to convert the isolation fluid layer into the isolation layer film. Parameters of the steam annealing treatment may include: gas including oxygen, ozone, and gaseous water, and an annealing temperature in a range of approximately 350° C.-750° C.

Figure 13:
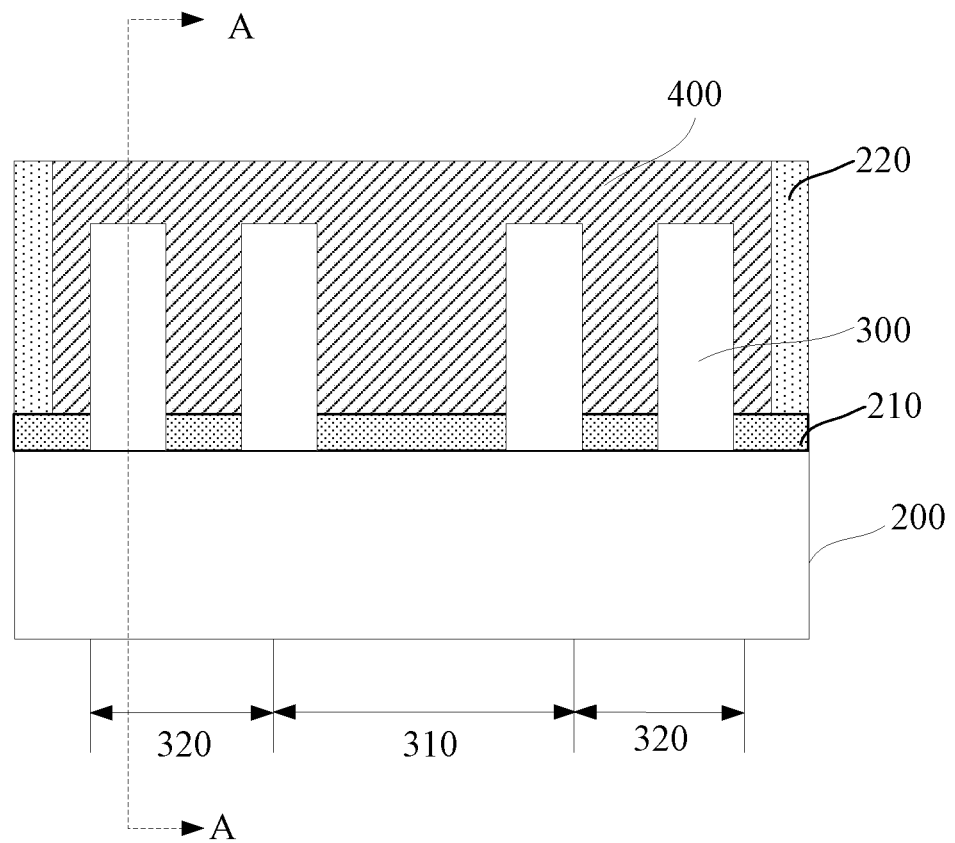
Figure 14:
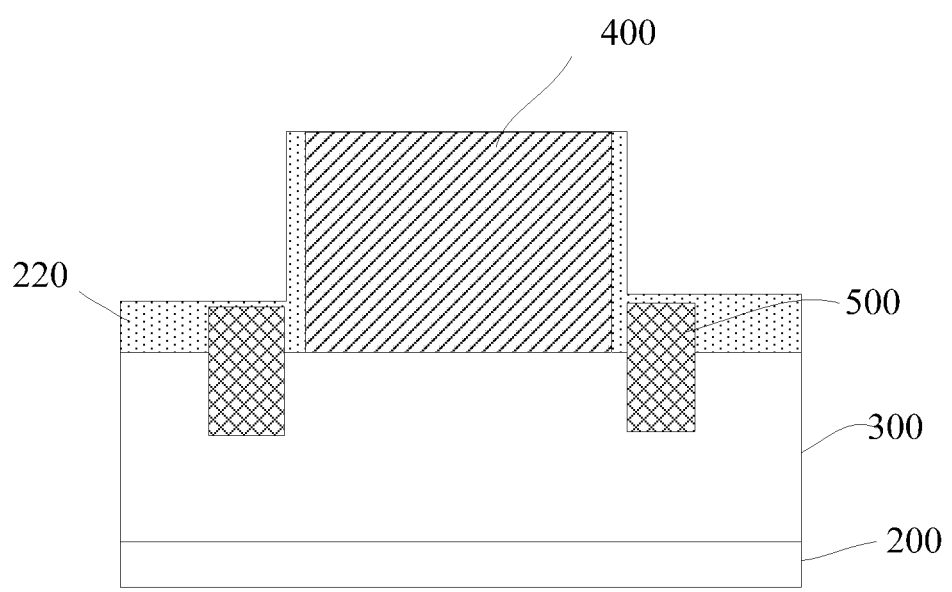

Returning to FIG. 28, after forming the fin, a gate structure and a source-drain doped layer may be formed (S102). FIGS. 13-14 illustrate a corresponding semiconductor structure.

FIG. 14 illustrates a schematic A-A sectional view of the structure in FIG. 13. Referring to FIG. 13 and FIG. 14, a gate structure 400 across a length portion of the fin 300 may be formed over the substrate 200, and a source-drain doped layer 500 may be formed in the fin 300 on both sides of the gate structure 400.

In one embodiment, the gate structure 400 may include a gate dielectric layer and a gate electrode layer on the gate dielectric layer. The gate dielectric layer may be made of a high-K (dielectric constant greater than 3.9) dielectric material, and the gate electrode layer may be made of a metal, such as tungsten.

In one embodiment, a sidewall spacer layer (not illustrated in the Figure) may be formed on the sidewall of the gate structure 400. In another embodiment, the sidewall spacer layer may not be formed on the sidewall of the gate structure 400. In one embodiment, the sidewall spacer layer may be configured to define the formation position of the source-drain doped layer.

In one embodiment, forming the gate structure 400 may include a gate-last process. A dummy gate structure across the fin 300 may be first formed over the substrate 200, then the formed dummy gate structure may be removed, and the gate structure 400 may be formed. In another embodiment, forming the gate structure 400 may include a gate-first process. The gate structure 400 across the fin 300 may be directly formed over the substrate 200.

In one embodiment, a trench may be formed in the fin 300 on both sides of the gate structure 400, and the source-drain doped layer 500 may be formed in the trench. The source-drain doped layer 500 may be doped by an ion implantation process.

In one embodiment, the source-drain doped layer 500 may include source-drain ions. When the semiconductor device is an N-type device, the conductivity type of the source-drain ions may be N type, such as phosphorus ions. When the semiconductor device is a P-type device, the conductivity type of the source-drain ions may be P type, such as boron ions.

In one embodiment, an etching stop layer 220 may be formed over the substrate 200, on a portion of the sidewall of the fin 300, on top and sidewall surfaces of the source-drain doped layer 500 and on the sidewall of the gate structure 400. In another embodiment, the etching stop layer 220 may not be formed.

In one embodiment, the etching stop layer 220 may be formed to protect the substrate 200, the fin 300, the gate structure 400, and the source-drain doped layer 500 covered by the etching stop layer 220 from being damaged in subsequent processes.

In one embodiment, the etching stop layer 220 may be made of silicon oxynitride. In another embodiment, the etching stop layer 220 may be made of one or more of silicon nitride, silicon oxynitride, silicon oxycarbide, silicon carbonitride and silicon oxy-carbo-nitride.

Figure 15:
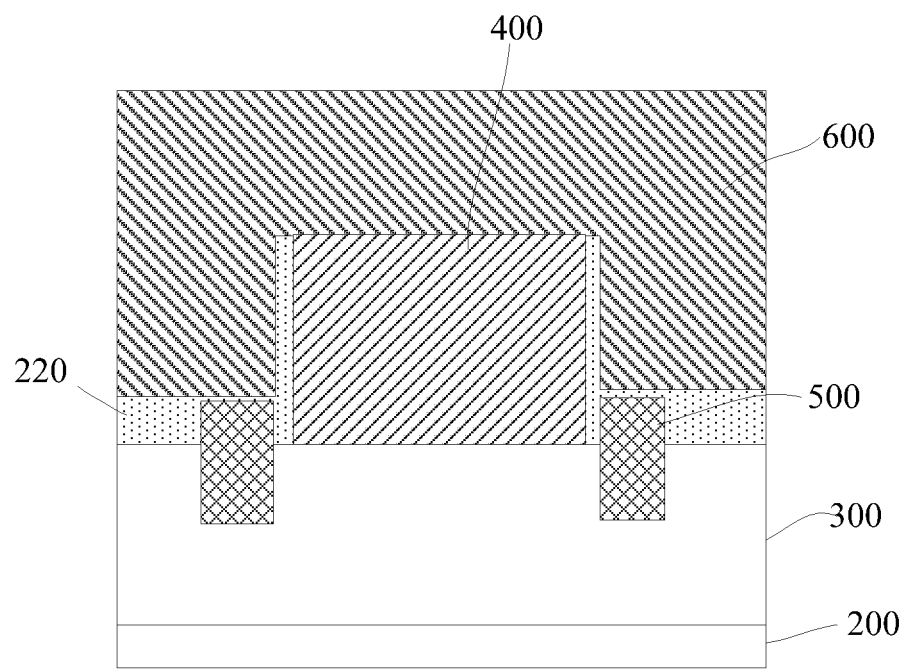
Figure 16:
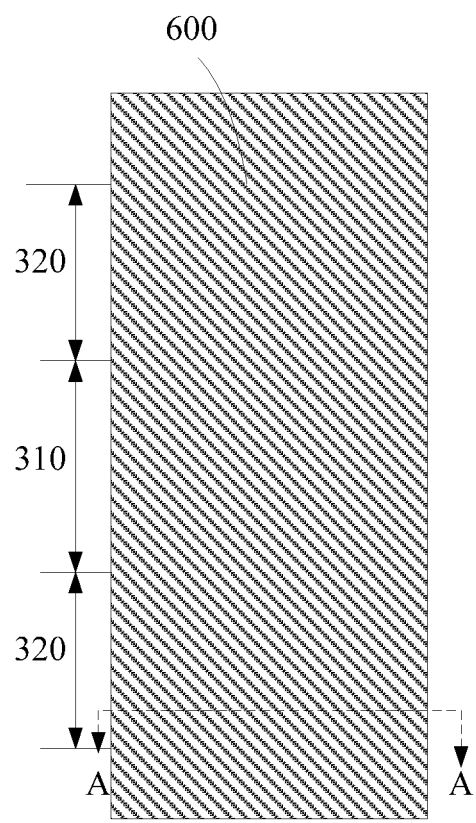

Returning to FIG. 28, after forming the gate structure and the source-drain doped layer, a dielectric layer may be formed (S103). FIGS. 15-16 illustrate a corresponding semiconductor structure.

FIG. 15 illustrates a schematic A-A sectional view of the structure in FIG. 16, and FIG. 16 illustrates a schematic top-view of the structure in FIG. 15. Referring to FIG. 15 and FIG. 16, a dielectric layer 600 may be formed over the substrate 200. The dielectric layer 600 may cover the top of the gate structure 400. For illustrative purposes, FIG. 15 and FIG. 16 merely illustrate one gate structure.

In one embodiment, the dielectric layer 600 may be made of silicon oxide. In another embodiment, the dielectric layer 600 may be made of one or more of silicon oxide, silicon nitride, silicon boronitride, silicon oxy-carbo-nitride and silicon oxynitride.

In one embodiment, the dielectric layer 600 may be formed by a chemical vapor deposition method. In another embodiment, the dielectric layer 600 may be formed by an atomic layer vapor deposition method, a physical vapor deposition method, or a combination thereof.

In one embodiment, after forming the dielectric layer 600, a planarization process may be performed on the dielectric layer 600. The planarization process may include a chemical mechanical polishing process, a back-etching process, or a combination thereof.

In one embodiment, process parameters of forming the dielectric layer 600 may include: gases including oxygen, ammonia ($NH_3$), and $N(SiH_3)_3$, where a flow rate of oxygen may be in a range of approximately 20 sccm-10000 sccm, a flow rate of ammonia ($NH_3$) may be in a range of approximately 20 sccm-10000 sccm, and a flow rate of $N(SiH_3)_3$ may be in a range of approximately 20 sccm-10000 sccm; a chamber pressure in a range of approximately 0.01 Torr-10 Torr, and a temperature in a range of approximately 30° C.-90° C.

A first through-hole 610 may be formed in the dielectric layer 600 on a side (e.g., a side of source region) of the gate structure 400 between the fins 300 in the fin sparse region 310, and a bottom of the first through-hole 610 may expose a top sidewall of the gate structure 400.

Figure 17:
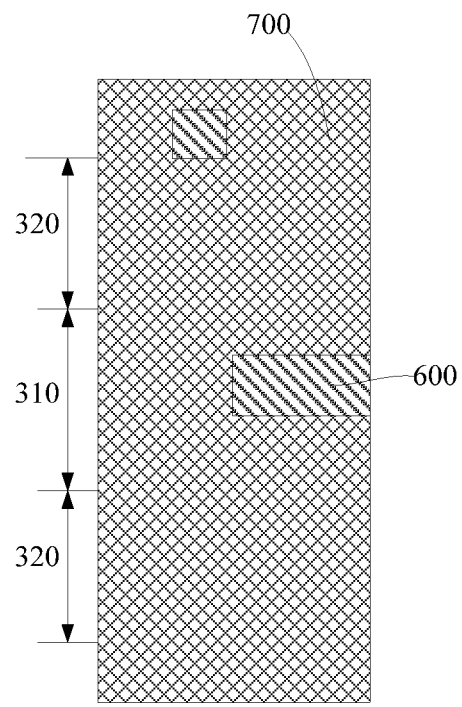

Returning to FIG. 28, after forming the dielectric layer, a first mask layer may be formed (S104). FIG. 17 illustrates a corresponding semiconductor structure.

Referring to FIG. 17, a first mask layer 700 may be formed on the dielectric layer 600, and an opening of the first mask layer 700 may expose the top of the dielectric layer 600 on a side (e.g., a side of source region) of the gate structure 400 between the fins 300 in the fin sparse region 310 and a portion of the dielectric layer 600 on the top of the gate structure 400.

In one embodiment, the first mask layer 700 may be made of photoresist. In one embodiment, forming the first mask layer 700 may include: forming an initial first mask layer on the dielectric layer 600; forming a mask layer on the initial first mask layer; using the mask layer as a mask, developing the initial first mask layer; and removing the mask layer. Therefore, the first mask layer 700 meeting the requirements may be formed on the dielectric layer 600.

Figure 18:
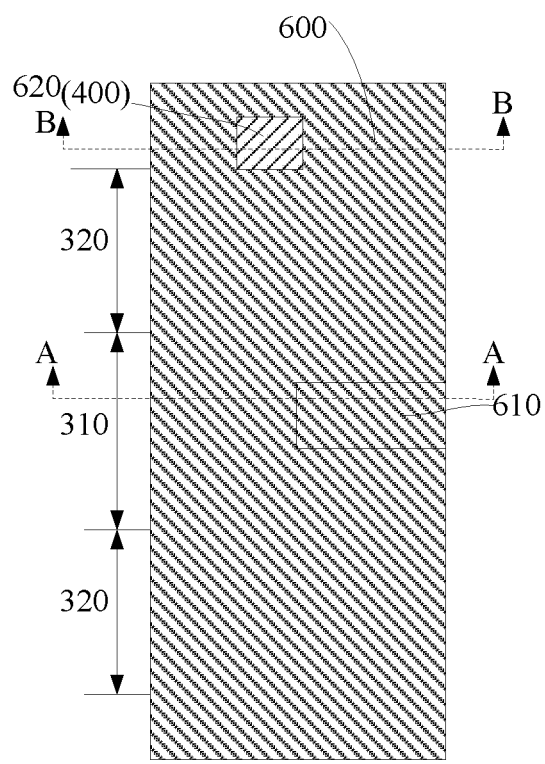
Figure 19:
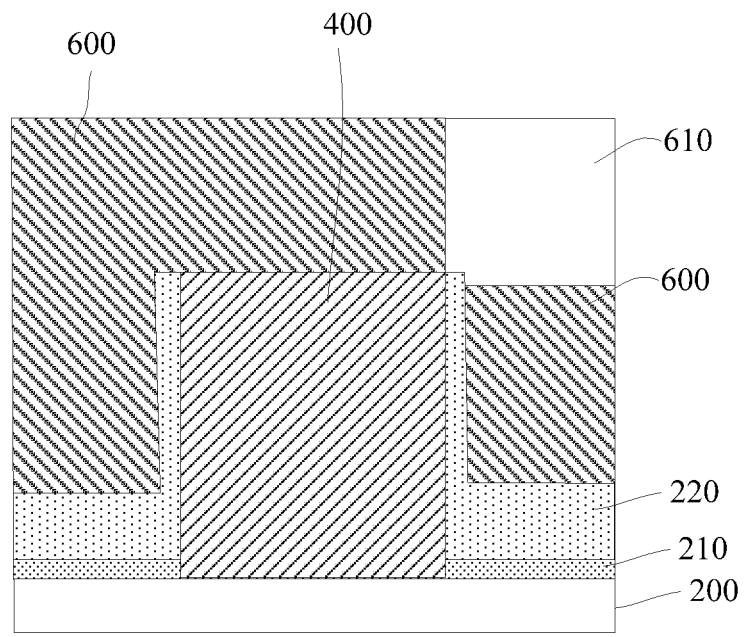
Figure 20:
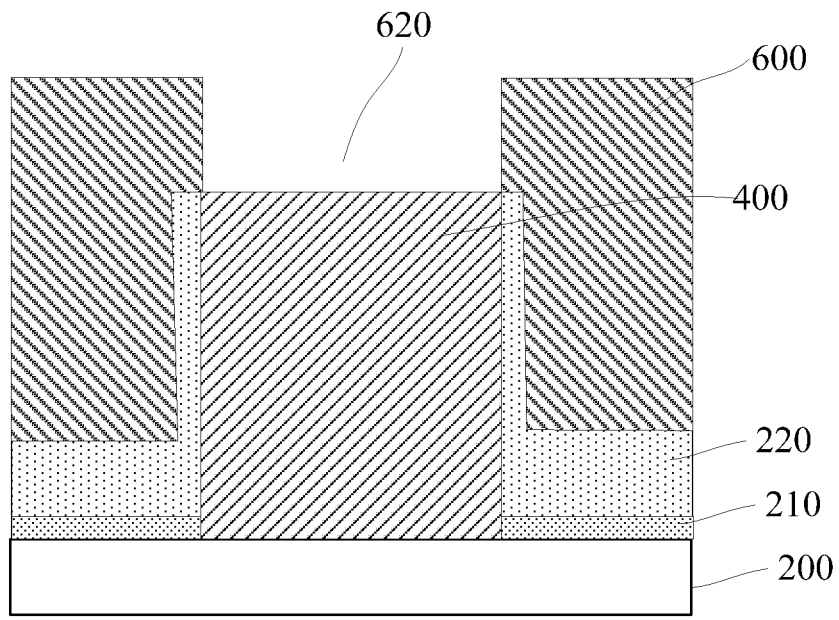

Returning to FIG. 28, after forming the first mask layer, a first through-hole and a second through-hole may be formed (S105). FIGS. 18-20 illustrate a corresponding semiconductor structure.

FIG. 18 illustrates a schematic top-view of the structure in FIG. 19 and FIG. 20, FIG. 19 illustrates a schematic A-A sectional view of the structure in FIG. 18, and FIG. 20 illustrates a schematic B-B sectional view of the structure in FIG. 18. Referring to FIGS. 18-20, using the first mask layer 700 as a mask, the exposed dielectric layer 600 may be removed by etching to form a first through-hole 610 and a second through-hole 620 in the dielectric layer 600, and the first mask layer 700 may be removed.

In one embodiment, referring to FIG. 19, using the first mask layer 700 as a mask, the exposed dielectric layer 600 may be removed by etching to form the first through-hole 610 in the dielectric layer 600.

In one embodiment, the bottom of the first through-hole 610 may expose the top sidewall of the gate structure 400. A metal layer may subsequently fill the first through-hole to connect the source-drain doped layers 500 in the fins 300 on both sides of the fin sparse region 310, to achieve the electrical connection between the junctions of the source-drain doped layers 500.

Referring to FIG. 20, using the first mask layer 700 as a mask, the exposed dielectric layer 600 may be removed by etching to form the second through-hole 620 in the dielectric layer 600.

In one embodiment, the bottom of the second through-hole 620 may expose a portion of the top surface of the gate structure 400. A metal layer may subsequently fill the second through-hole to achieve an electrical connection with the gate structure 400.

In one embodiment, the electrical connection between the source-drain doped layers 500 in the fins 300 on both sides of the fin sparse region 310 may be achieved by filling the first through-hole 610 with a metal layer. Because the bottom of the first through-hole 610 exposes the top sidewall of the gate structure 400, a depth of the formed first through-hole 610 may be greatly reduced, and a volume of the metal layer filled in the first through-hole 610 may be greatly reduced. Therefore, during the use of the semiconductor device, the parasitic capacitance generated between the gate structure 400 and the junction of the source-drain doped layers 500 in the fin sparse region 310 may be reduced. Thus, the thermal noise generated during the use of the semiconductor device may be reduced, the sensitivity and performance stability of the semiconductor device may be improved, and the quality of the formed semiconductor device may be greatly improved.

In one embodiment, the first through-hole 610 and the second through-hole 620 may be formed by a dry etching process. In another embodiment, the first through-hole 610 and the second through-hole 620 may be formed by a wet etching process.

In one embodiment, process parameters for forming the first through-hole 610 and the second through-hole 620 may include: etching gases including helium (He), ammonia ($NH_3$) and $NF_3$, where a flow rate of the helium (He) may be in a range of approximately 600 sccm-2000 sccm, a flow rate of the ammonia ($NH_3$) may be in a range of approximately 200 sccm-5000 sccm, a flow rate of the $NF_3$ may be in a range of approximately 20 sccm-2000 sccm; an etching pressure in a range of approximately 2 mTorr-100 mTorr; and an etching process duration in a range of approximately 20 s-1000 s.

In one embodiment, the first through-hole 610 and the second through-hole 620 may be formed using a same mask layer, such that the formed first through-hole 610 and the second through-hole 620 may have a same depth, to prevent the depth of the first through-hole 610 from being too large. On the one hand, the depth of the formed first through-hole 610 may be conveniently controlled. On the other hand, the depth of the formed first through-hole 610 may be controlled without an additional mask layer, thereby saving the cost and simplifying the process flow.

Figure 21:
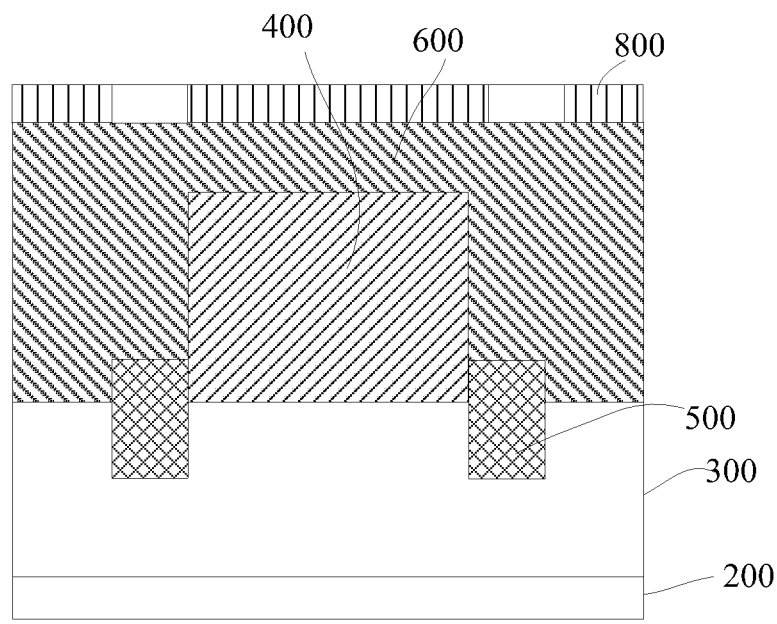
Figure 22:
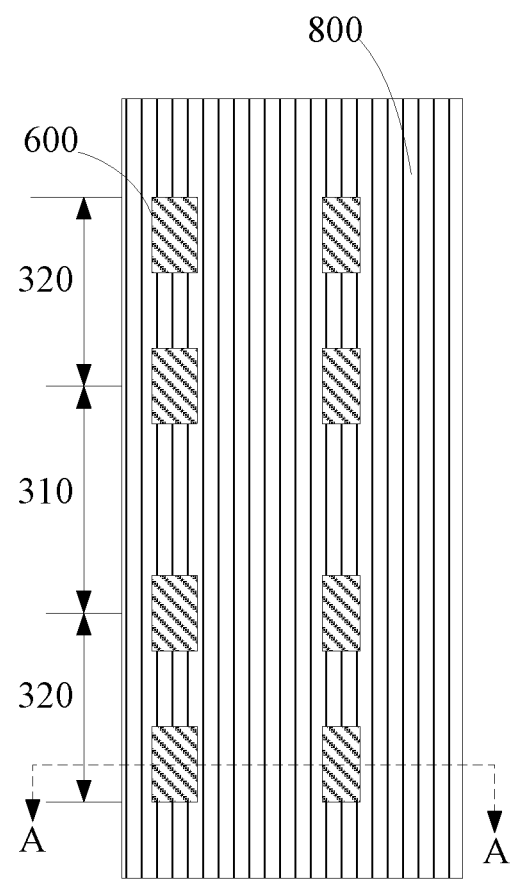

Returning to FIG. 28, after forming the first through-hole and the second through-hole, a second mask layer may be formed (S106). FIGS. 21-22 illustrate a corresponding semiconductor structure.

FIG. 22 illustrates a schematic top-view of the structure in FIG. 21, and FIG. 21 illustrates a schematic A-A sectional view of the structure in FIG. 22. Referring to FIG. 21 and FIG. 22, a second mask layer 800 may be formed on the dielectric layer 600. An opening of the second mask layer 800 may expose the dielectric layer 600 on the top of the source-drain doped layer 500.

In one embodiment, the second mask layer 800 may be made of photoresist. The second mask layer may be formed by the same steps as the first mask layer 700, which may not be repeated herein.

Figure 23:
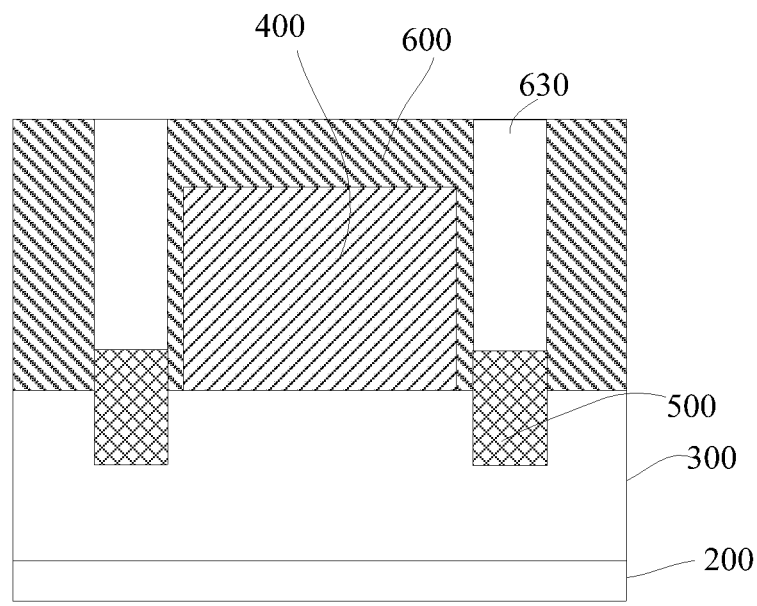

Returning to FIG. 28, after forming the second mask layer, a third through-hole may be formed (S107). FIG. 23 illustrates a corresponding semiconductor structure.

Referring to FIG. 23, the exposed dielectric layer 600 may be removed by etching until the top surface of the source-drain doped layer 500 is exposed, to form a third through-hole 630 in the dielectric layer 600. The second mask layer 800 may be removed.

In one embodiment, process parameters for forming the third through-hole 630 may include: etching gases including helium (He), ammonia ($NH_3$) and $NF_3$, where a flow rate of the helium (He) may be in a range of approximately 600 sccm-2000 sccm, a flow rate of the ammonia ($NH_3$) may be in a range of approximately 200 sccm-5000 sccm, a flow rate of the $NF_3$ may be in a range of approximately 100 sccm-2000 sccm; an etching pressure in a range of approximately 50 mTorr-100 mTorr; and an etching process duration in a range of approximately 500 s-1000 s.

Returning to FIG. 28, after forming the third through-hole, a metal layer may be formed to fill the first through-hole, the second through-hole and the third through-hole (S108). FIGS. 24-27 illustrate a corresponding semiconductor structure.

Figure 24:
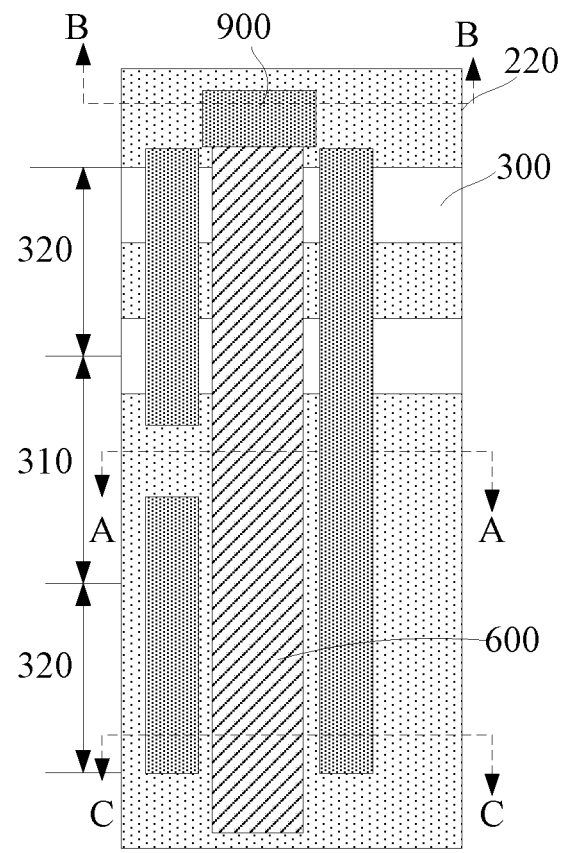
Figure 25:
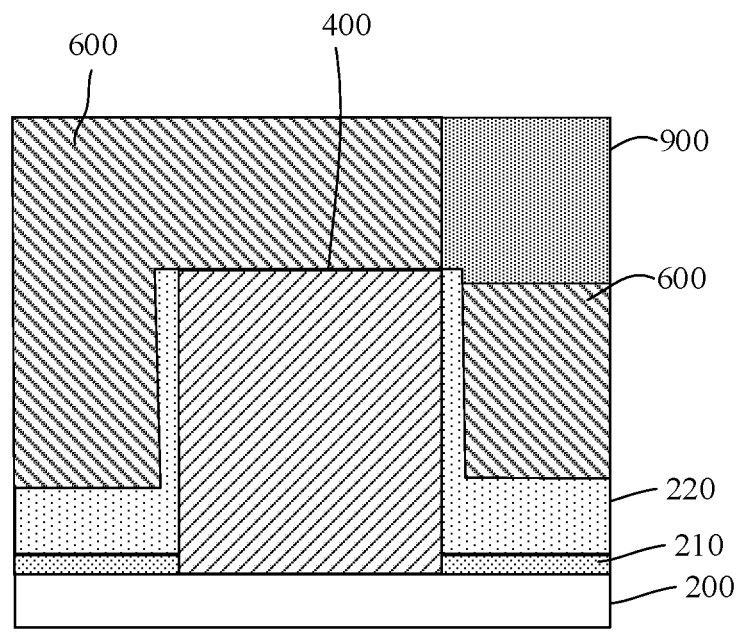
Figure 26:
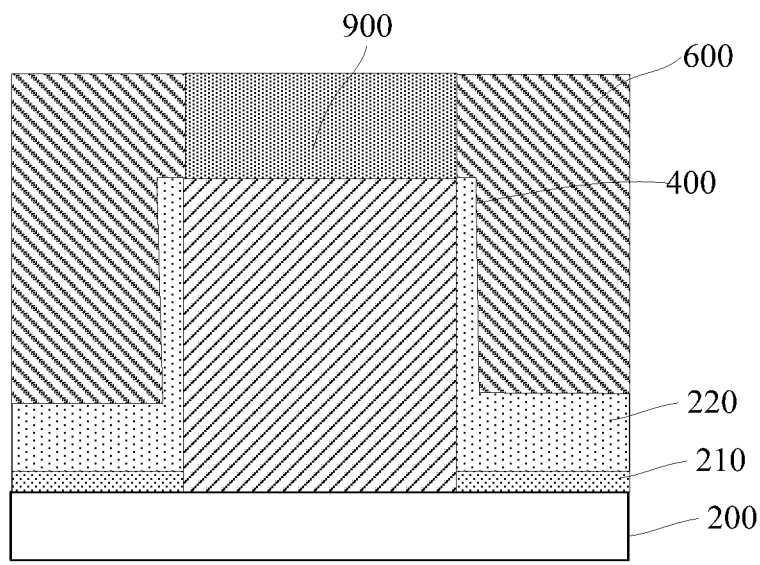
Figure 27:
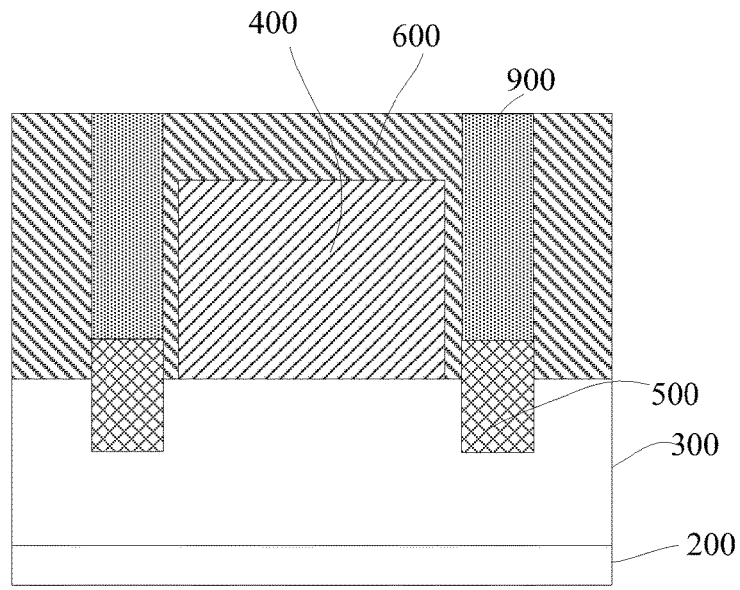
Figure 28:
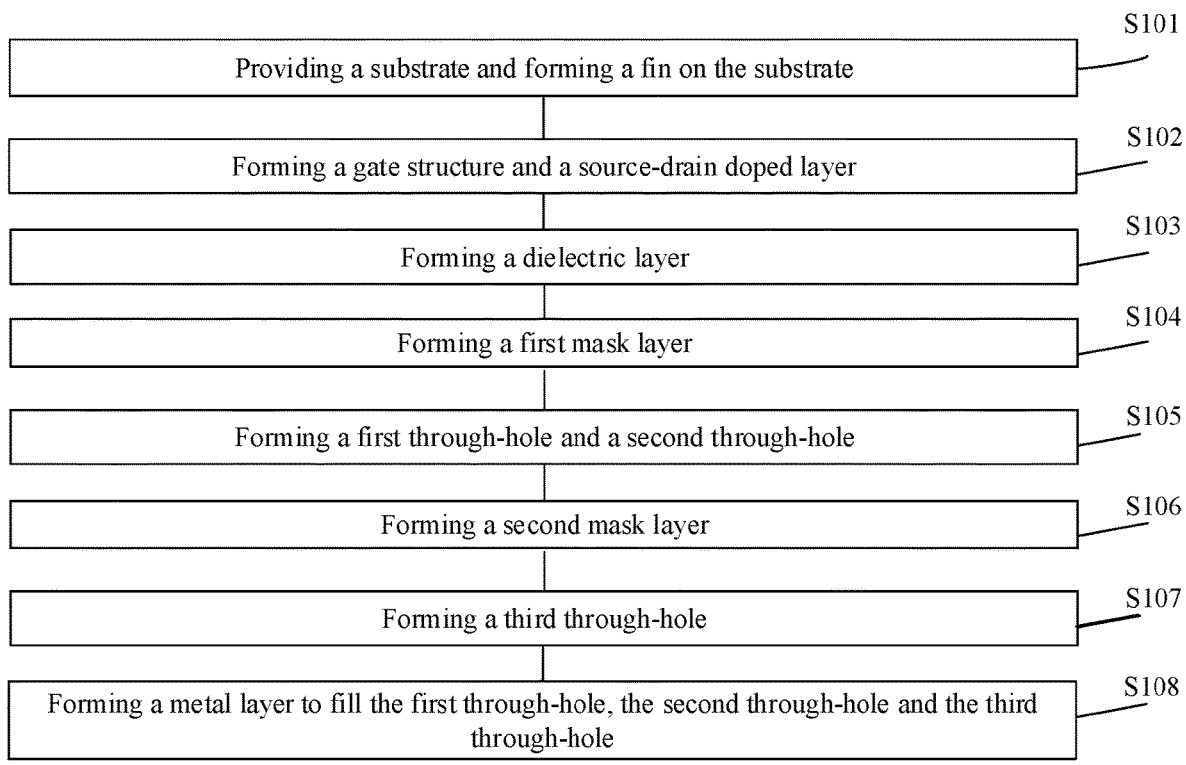
FIG. 28 illustrates a flowchart of an exemplary method for forming a semiconductor device consistent with various disclosed embodiments of the present disclosure.

FIG. 24 illustrates a schematic top-view of the structure in FIGS. 25-27, FIG. 25 illustrates a schematic A-A sectional view of the structure in FIG. 24, FIG. 26 illustrates a schematic B-B sectional view of the structure in FIG. 24, and FIG. 27 illustrates a schematic C-C sectional view of the structure in FIG. 24. Referring to FIGS. 24-27, the first through-hole 610, the second through-hole 620, and the third through-hole 630 may be filled with a metal layer 900, and the dielectric layer 600 may be removed.

In one embodiment, referring to FIG. 25, the metal layer 900 may fill the first through-hole 610 for connecting the source-drain doped layers 500 in the fins in the fin sparse region 310, to achieve the electrical connection between the source-drain doped layers 500 in the fins in the fin sparse region 310.

In one embodiment, referring to FIG. 26, the metal layer 900 may fill the second through-hole 620 to achieve electrical connection with the gate structure 400.

In one embodiment, referring to FIG. 27, the metal layer 900 may fill the third through-hole 630 to form a conductive structure on the source-drain doped layer 500, to achieve the electrical connection with the source-drain doped layer 500.

In one embodiment, the metal layer 900 may be made of tungsten. In another embodiment, the metal layer 900 may be made of cobalt, titanium, nickel, or a combination thereof.

In one embodiment, the metal layer 900 may be formed by an atomic layer deposition method. In another embodiment, the metal layer 900 may be formed by a chemical vapor deposition method, a physical vapor deposition method, or a combination thereof.

In one embodiment, the reason of forming the metal layer 900 by the atomic layer deposition method may include that the atomic layer deposition method may have desired material step coverage capability, and may be capable of forming the metal layer 900 with desired quality in the first through-hole 610, the second through-hole 620 and the third through-hole 630, thereby improving the quality of the formed semiconductor device.

In one embodiment, before forming the metal layer 900, an adhesion layer (not illustrated in the Figure) may be formed on the bottom and sidewalls of the first through-hole 610, the second through-hole 620, and the third through-hole 630. The formed adhesion layer may facilitate the adhesion of the subsequently formed metal layer 900, and may improve the quality of the formed metal layer 900.

In one embodiment, the adhesion layer may be a Ti/TiN layer formed by a physical vapor deposition method. A thickness of Ti film may be in a range of approximately 150 Å-210 Å, and a thickness of TiN film may be in a range of approximately 490 Å-550 Å. Ar gas may be introduced to bombard a Ti target to deposit the Ti film. Ar and $N_2$ gases may be introduced to bombard the Ti target to deposit the TiN film. After forming the adhesion layer, an annealing treatment may be performed to repair the damaged surface of the substrate 200.

In one embodiment, forming the metal layer 900 may include: first forming a seed layer of the metal layer 900 on the bottom and sidewalls of the first through-hole 610, the second through-hole 620, and the third through-hole 630; and then depositing a large amount of material of the metal layer on the seed layer of the metal layer 900, to form the metal layer 900.

In one embodiment, the metal layer 900 may be made of tungsten. Gases for forming the metal layer 900 may include $WF_6$, $SiH_4$, and $H_2$. The metal layer may be formed by a chemical vapor deposition method.

Correspondingly, the present disclosure also provides a semiconductor device formed by the above-disclosed method. The semiconductor device may include: a substrate 200 including a fin dense region 320 and a fin sparse region 310; a fin 300 on the substrate 200; a gate structure 400 on the substrate 200 and across the fin 300; a source-drain doped layer 500 in the fin 300 on both sides of the gate structure 400; a dielectric layer 600 on the substrate 200 and covering the gate structure 400; and a first through-hole 610 in the dielectric layer 600 on a side (e.g., a side of source region) of the gate structure 400 between the fins 300 in the fin sparse region 310, where a bottom of the first through-hole exposes a top sidewall of the gate structure 400.

In one embodiment, the bottom of the formed first through-hole 610 may merely expose the top sidewall of the gate structure 400, and, thus, the depth of the formed first through-hole 610 may be reduced. Therefore, when filling the first through-hole 610 with a metal layer, a volume of the filled metal layer may be reduced, thereby reducing the parasitic capacitance generated between the gate structure and the junction of the source-drain doped layers in the fins in the fin sparse region during the use of the semiconductor device, and improving the performance and quality of the formed semiconductor device.

The disclosed embodiments may have following beneficial effects. When forming the fin, the gate structure across the fin, and the source-drain doped layer in the fin on both sides of the gate structure over the substrate, the dielectric layer covering the top of the gate structure may be formed over the substrate. A first through-hole may be formed in the dielectric layer on the side (e.g., a side of source region) of the gate structure between the fins in the fin sparse region. The bottom of the first through-hole may expose the top sidewall of the gate structure, and the depth of the first through-hole may be substantially small. When subsequently filling the first through-hole with the metal layer, the volume of the metal layer filled in the first through-hole may be reduced. Therefore, the parasitic capacitance generated between the gate structure and the junction of the source-drain doped layers may be reduced, thereby improving the device performance and quality of the formed semiconductor device, and improving the sensitivity.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
    providing a substrate;
    forming a fin on the substrate, wherein the substrate includes a fin dense region and a fin sparse region;
    forming a gate structure across the fin over the substrate;
    forming a source-drain doped layer in the fin on both sides of the gate structure;
    forming a dielectric layer over the substrate, wherein the dielectric layer covers a top of the gate structure; and
    forming a first through-hole in the dielectric layer on a side of the gate structure in the fin sparse region, wherein a bottom of the first through-hole exposes a top sidewall of the gate structure, and in an extending direction of the fin, the first through-hole and the gate structure are located on opposite sides of a corresponding sidewall surface of the gate structure, respectively.

2. The method according to claim 1, wherein:
    the dielectric layer is made of a material including silicon oxide, silicon nitride, silicon boronitride, silicon oxycarbo-nitride, silicon oxynitride, or a combination thereof.

3. The method according to claim 1, wherein:
    forming the first through-hole includes a dry etching method, a wet etching method, or a combination thereof.

4. The method according to claim 1, further including:
    etching the dielectric layer on the top of the gate structure to form a second through-hole in the dielectric layer, wherein the second through-hole exposes a portion of the top of the gate structure.

5. The method according to claim 4, wherein forming the first through-hole and the second through-hole includes:
    forming a first mask layer on the dielectric layer, wherein the first mask layer has openings exposing a top of the dielectric layer on the side of the gate structure in the fin sparse region and a portion of the dielectric layer on the top of the gate structure, respectively;
    using the first mask layer as a mask, removing the exposed dielectric layer by etching to form the first through-hole and the second through-hole in the dielectric layer; and
    removing the first mask layer.

6. The method according to claim 4, further including:
    etching the dielectric layer on the source-drain doped layer until a top of the source-drain doped layer is exposed, to form a third through-hole in the dielectric layer.

7. The method according to claim 6, wherein forming the third through-hole includes:
    forming a second mask layer on the dielectric layer, wherein the second mask layer has an opening exposing the dielectric layer on the top of the source-drain doped layer;
    removing the exposed dielectric layer by etching to form the third through-hole in the dielectric layer; and
    removing the second mask layer.

8. The method according to claim 7, after forming the third through-hole, further including:
    forming a metal layer to fill the first through-hole, the second through-hole and the third through-hole.

9. The method according to claim 8, wherein:
    the metal layer is made of tungsten, cobalt, titanium, nickel, or a combination thereof.

10. The method according to claim 8, wherein:
    forming the metal layer includes an atomic layer deposition method, a chemical vapor deposition method, a physical vapor deposition method, or a combination thereof.

11. The method according to claim 1, further including:
    forming an isolation layer on the substrate and covering a portion of a sidewall of the fin.

12. The method according to claim 1, before forming the dielectric layer on the substrate, further including:
    forming an etching stop layer over the substrate, on a portion of a sidewall of the fin, on top and sidewall surfaces of the source-drain doped layer, and on a sidewall of the gate structure.

13. The method according to claim 8, before forming the metal layer, further including:
    forming an adhesion layer on the bottom and sidewalls of the first through-hole, the second through-hole, and the third through-hole.

14. A semiconductor device, comprising:
    a substrate;
    a fin on the substrate, wherein the substrate includes a fin dense region and a fin sparse region;
    a gate structure over the substrate and across the fin;
    a source-drain doped layer in the fin on both sides of the gate structure;
    a dielectric layer over the substrate and covering the gate structure; and
    a first through-hole in the dielectric layer on a side of the gate structure between fins in the fin sparse region, wherein a bottom of the first through-hole exposes a top sidewall of the gate structure, and in an extending direction of the fin, the first through-hole and the gate structure are located on opposite sides of a corresponding sidewall surface of the gate structure, respectively.

15. The semiconductor device according to claim 14, wherein:

the dielectric layer is made of a material including silicon oxide, silicon nitride, silicon boronitride, silicon oxycarbo-nitride, silicon oxynitride, or a combination thereof.

16. The semiconductor device according to claim 14, wherein:

the dielectric layer further contains a second through-hole, wherein a bottom of the second through-hole exposes a portion of a top of the gate structure.

17. The semiconductor device according to claim 16, wherein:

the dielectric layer further contains a third through-hole, wherein a bottom of the third through hole exposes a top of the source-drain doped layer.

18. The semiconductor device according to claim 17, further including:

a metal layer, filling the first through-hole, the second through-hole and the third through-hole.

19. The semiconductor device according to claim 18, wherein:

the metal layer is made of tungsten, cobalt, titanium, nickel, or a combination thereof.

20. The semiconductor device according to claim 14, further including:

an etching stop layer over the substrate, on a portion of a sidewall of the fin, on top and sidewall surfaces of the source-drain doped layer, and on a sidewall of the gate structure.

* * * * *